United States Patent
Taylor et al.

(10) Patent No.: US 9,842,695 B2
(45) Date of Patent: Dec. 12, 2017

(54) PLZT CAPACITOR AND METHOD TO INCREASE THE DIELECTRIC CONSTANT

(71) Applicants: Ralph S. Taylor, Noblesville, IN (US); Manuel Ray Fairchild, Kokomo, IN (US); Uthamalingam Balachjandran, Willowbrook, IL (US); Tae H. Lee, Naperville, IL (US)

(72) Inventors: Ralph S. Taylor, Noblesville, IN (US); Manuel Ray Fairchild, Kokomo, IN (US); Uthamalingam Balachjandran, Willowbrook, IL (US); Tae H. Lee, Naperville, IL (US)

(73) Assignee: DELPHI TECHNOLOGIES, INC., Troy, MI (US)

( * ) Notice: Subject to any disclaimer, the term of this patent is extended or adjusted under 35 U.S.C. 154(b) by 0 days.

(21) Appl. No.: 15/151,830

(22) Filed: May 11, 2016

(65) Prior Publication Data
US 2017/0330685 A1 Nov. 16, 2017

(51) Int. Cl.
*H01G 4/12* (2006.01)
*H01G 4/30* (2006.01)

(52) U.S. Cl.
CPC .......... *H01G 4/1218* (2013.01); *H01G 4/30* (2013.01)

(58) Field of Classification Search
CPC .............................. H01G 4/1218; H01G 4/30
See application file for complete search history.

(56) References Cited

U.S. PATENT DOCUMENTS

| | | | | |
|---|---|---|---|---|
| 5,950,292 | A * | 9/1999 | Dimos | H01L 21/6835 216/13 |
| 2006/0276050 | A1* | 12/2006 | Song | H01L 21/02186 438/758 |
| 2015/0364257 | A1* | 12/2015 | Ma | H01G 4/26 361/301.4 |

* cited by examiner

*Primary Examiner* — Dion R Ferguson
(74) *Attorney, Agent, or Firm* — Lawrence D. Hazelton

(57) ABSTRACT

A ceramic-capacitor includes a first electrically-conductive-layer, a second electrically-conductive-layer arranged proximate to the first electrically-conductive-layer, and a dielectric-layer interposed between the first electrically-conductive-layer and the second electrically-conductive-layer. The dielectric-layer is formed of a lead-lanthanum-zirconium-titanate material (PLZT), wherein the PLZT is characterized by a dielectric-constant greater than 125, when measured at 25 degrees Celsius and zero Volts bias, and an excitation frequency of ten-thousand Hertz (10 kHz). A method for increasing a dielectric constant of the lead-lanthanum-zirconium-titanate material (PLZT) includes the steps of depositing PLZT to form a dielectric-layer of a ceramic-capacitor, and heating the ceramic-capacitor to a temperature not greater than 300° C.

3 Claims, 2 Drawing Sheets

PLZT CAPACITOR AND METHOD TO INCREASE THE DIELECTRIC CONSTANT

GOVERNMENT LICENSE RIGHTS STATEMENT

This is an invention jointly developed by Argonne National Laboratory and Delphi Automotive System, LLC. The United States Government has rights in this invention pursuant to Contract No. DE-AC02-06CH11357 between the United States Government and UChicago Argonne, LLC representing Argonne National Laboratory and pursuant to Sub Contract No. 4F-31041 between the United States Government/Department of Energy (Argonne National Laboratory) and Delphi Automotive Systems, LLC.

TECHNICAL FIELD OF INVENTION

This disclosure generally relates to a ceramic-capacitor, and more particularly relates to a ceramic-capacitor with a lead-lanthanum-zirconium-titanate (PLZT) dielectric material.

BACKGROUND OF INVENTION

It is known that the high-voltage, DC-link capacitors used in electric vehicle invertors require large packaging volumes. In one example of a typical electric vehicle invertor, the DC-link capacitor is the heaviest single component, accounts for nearly forty percent (40%) of the total inverter volume, and is a significant portion of the inverter cost. DC-link capacitors are typically wound polypropylene film capacitors, with packaging volumes of greater than, or equal to, one liter. Disadvantageously, polypropylene film capacitors are limited in their service temperature by the film material, which can be as low as 85 degrees Celsius (85° C.). In contrast, ceramic capacitors are capable of service temperatures of greater than 140° C., but require high firing temperatures in excess of 650° C. to sinter the ceramic particles into a monolithic layer.

SUMMARY OF THE INVENTION

Described herein is a ceramic-capacitor that can be fabricated with film manufacturing processes and heat-treated to significantly increase the dielectric constant of the lead-lanthanum-zirconium-titanate (PLZT) dielectric material, thereby greatly reducing the amount of capacitive material required to meet the targeted capacitance/voltage rating characteristics. The significant reduction in the amount of capacitive material will, in turn, greatly reduce the packaging volume of the DC-link capacitor.

In accordance with one embodiment, a ceramic-capacitor is provided. The ceramic-capacitor includes a first electrically-conductive-layer. The ceramic-capacitor also includes a second electrically-conductive-layer arranged proximate to the first electrically-conductive-layer. The ceramic-capacitor also includes a dielectric-layer interposed between the first electrically-conductive-layer and the second electrically-conductive-layer. The dielectric-layer is formed of a lead-lanthanum-zirconium-titanate material (PLZT), wherein the PLZT is characterized by a dielectric-constant greater than 125 when measured at 25 degrees Celsius, zero Volts bias, and an excitation frequency of ten-thousand Hertz (10 kHz).

In another embodiment, a method for increasing a dielectric constant of lead-lanthanum-zirconium-titanate material (PLZT) is provided. The method includes the step of depositing PLZT to form a dielectric-layer of a ceramic-capacitor. The method also includes the step of heating the ceramic-capacitor to a temperature not greater than 300° C.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
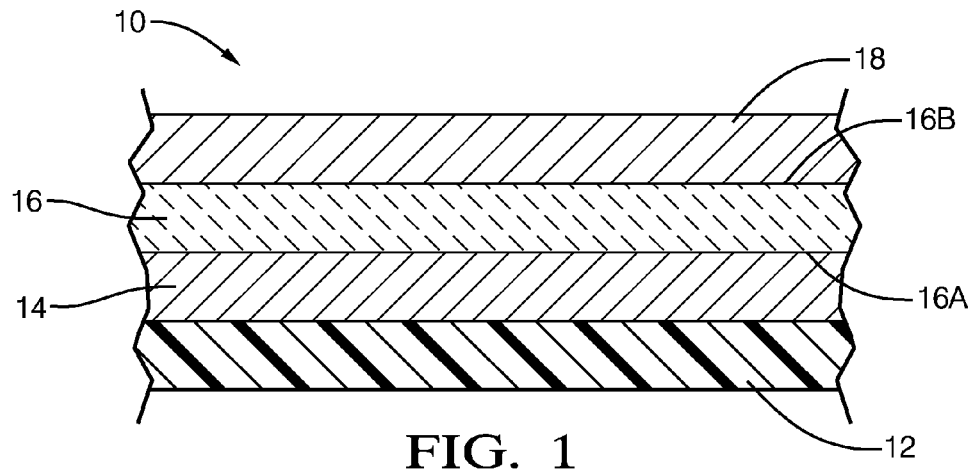
FIG. 1 is a cross-sectional end view of a ceramic-capacitor in accordance with one embodiment.

FIG. 1 illustrates a non-limiting example of a ceramic-capacitor 10. The relative thickness of the layers illustrated is not meant to infer anything regarding relative thickness of the actual layers of materials used to form the ceramic-capacitor 10, but are only shown to easier visualize the description presented below. Other features of the ceramic-capacitor 10 are contemplated, but not illustrated, such as contacts or terminations that electrically connect the ceramic-capacitor 10 to other circuitry, as will be recognized by those skilled in the capacitor fabrication arts.

The ceramic-capacitor 10 includes a substrate 12. By way of example and not limitation, the substrate 12 may be formed of a polymeric material such as APICAL® AV polyimide film from Kaneka Texas Corporation of Pasadena Tex., with a thickness of 50 micrometers (50 µm). Such polymeric substrates are commonly used in the fabrication of film-type capacitors and are suitable for use in high-volume, roll-to-roll, manufacturing processes. Alternatively, the substrate may be a metal foil. The ceramic-capacitor 10 also includes a first electrically-conductive-layer 14. By way of example and not limitation, the first electrically-conductive-layer 14 may be deposited by the known electron-beam evaporation process onto the substrate 12. Preferably the first electrically-conductive-layer 14 is aluminum, with a thickness of 100 nanometers (nm) to a thickness of 200 nm, and preferably 120 nm. Alternatively, the first electrically-conductive-layer 14 may be formed of platinum, copper, or nickel.

A second electrically-conductive-layer 18 is arranged proximate to the first electrically-conductive-layer 14. By way of example and not limitation, the second electrically-conductive-layer 18 may be deposited by the known electron-beam evaporation process onto a dielectric-layer 16 (described below) that may overlay the first electrically-conductive-layer 14. Preferably the second electrically-conductive-layer 18 is aluminum, with a thickness of 100 nanometers (nm) to a thickness of 200 nm, and preferably 120 nm. Alternatively, the second electrically-conductive-layer 18 may be formed of platinum, copper, or nickel.

The dielectric-layer 16 is interposed between the first electrically-conductive-layer 14 and the second electrically-conductive-layer 18, such that the first side 16A of the dielectric-layer 16 is in direct contact with the first electrically-conductive-layer 14, and the second side 16B of the dielectric-layer 16, opposite the first side, is in direct contact with second electrically-conductive-layer 18. The dielectric-layer 16 is formed of a lead-lanthanum-zirconium-titanate material (PLZT). PLZT is a ceramic material that has a relatively high dielectric constant when compared to other common dielectric materials, and is capable of operating at temperatures greater than 140° C. Empirical testing has indicated that a thickness for the PLZT layer of 8 µm provides for a good balance between reliability and dielectric breakdown, where the desired maximum capacitor voltage is 600 Volts. The PLZT, deposited according to the process described elsewhere herein, is generally observed to have a linear relationship of the dielectric constant over voltage, frequency and temperature, and is characterized by a dielectric constant greater than one-hundred-twenty-five (125), when measured at 25° C., zero Volts bias, and an excitation frequency of ten-thousand Hertz (10 kHz). The dielectric constant is dimensionless, as it is defined as the ratio of the permittivity (in Farads per meter) of the dielectric material used in the capacitor, to the permittivity of a vacuum.

Figure 2:
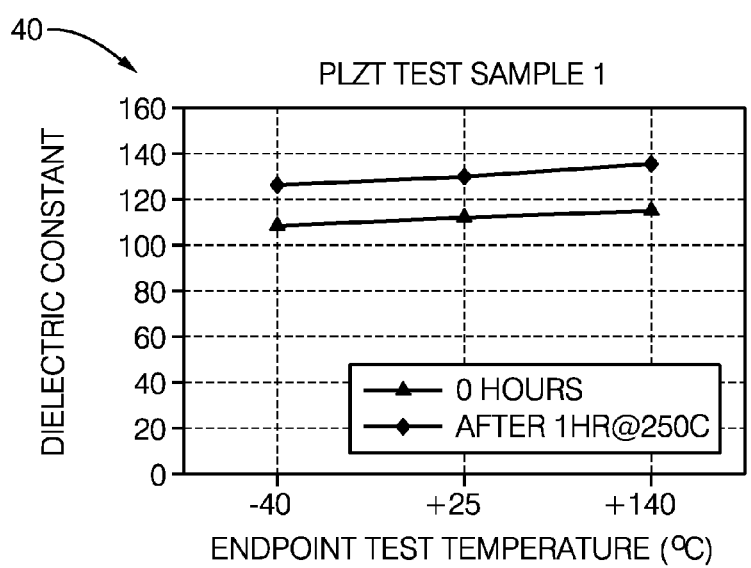
FIG. 2 is a graph showing an increase in the dielectric constant after heat-treating in accordance with one embodiment.

FIG. 2 is a non-limiting example of a graph 40 that illustrates the increase in the dielectric constant of the PLZT, having an elemental ratio of Pb0.92/La0.08/Zr0.52/Ti0.48/Oδ, after heat-treating the ceramic-capacitor 10 for one hour (1-hour) at a temperature of 250° C., as will be described by the method, herein. The heat-treated PLZT is characterized by a relative permittivity or dielectric constant greater than 125 at 25° C., zero Volts bias, and an excitation frequency of 10 kHz, compared to the non-heat-treated PLZT capacitor in the as-deposited, or zero-hour, state, which is less than 125 at 25° C., zero Volts bias, and an excitation frequency of 10 kHz. It was discovered that the dielectric constant of the heat-treated PLZT was increased by twenty percent (20%) over the non-heat-treated PLZT. The details of the heat-treating process are described elsewhere herein. Note also the relatively linear relationship of the dielectric constant over the temperature range of −40° C. to a temperature of 140° C., for both the non-heat-treated and heat-treated PLZT, as previously described.

Figure 3:
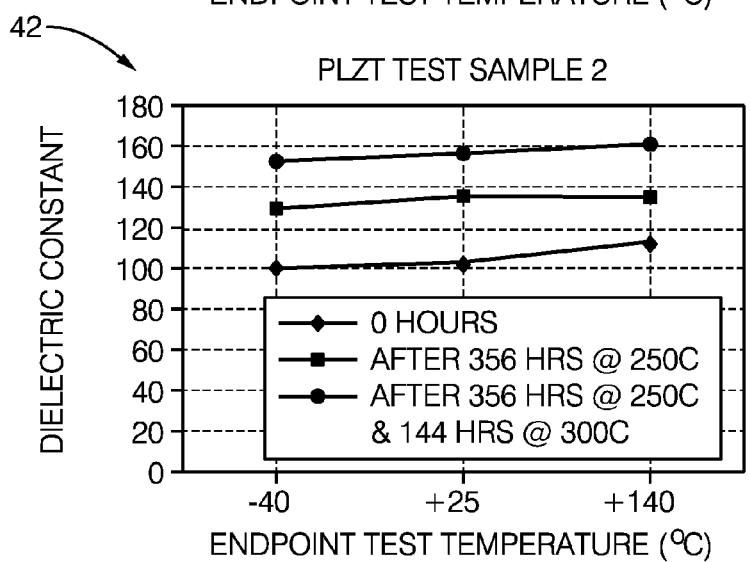
FIG. 3 is a graph showing an increase in the dielectric constant after heat-treating in accordance with one embodiment.

FIG. 3 is a non-limiting example of a graph 42 that illustrates the increase in the dielectric constant of the PLZT after the heat-treating of another sample of the ceramic-capacitor 10, fabricated by the same process, and containing the same elemental ratios, as the ceramic-capacitor 10 of FIG. 2. The heat-treated PLZT is characterized by a dielectric constant of greater than 125 at 25° C., zero Volts bias, and an excitation frequency of 10 kHz, compared to the non-heat-treated PLZT capacitor in the as-deposited, or zero-hour, state. In this example, the dielectric constant of the PLZT was increased by 32%, after heat-treating for 356-hours at a temperature of 250° C., over the non-heat-treated PLZT. Upon further heat-treating for an additional 144-hours at a temperature of 300° C., the dielectric constant of the heat-treated PLZT was increased by 52% over the non-heat-treated PLZT. Note again the relatively linear relationship of the dielectric constant over the temperature range of −40° C. to a temperature of 140° C., for both the non-heat-treated and heat-treated PLZT, as was previously described. Testing has indicated that the impact of heat-treating at temperatures greater than 300° C. resulted in a reduction in the dielectric breakdown strength.

Figure 4:
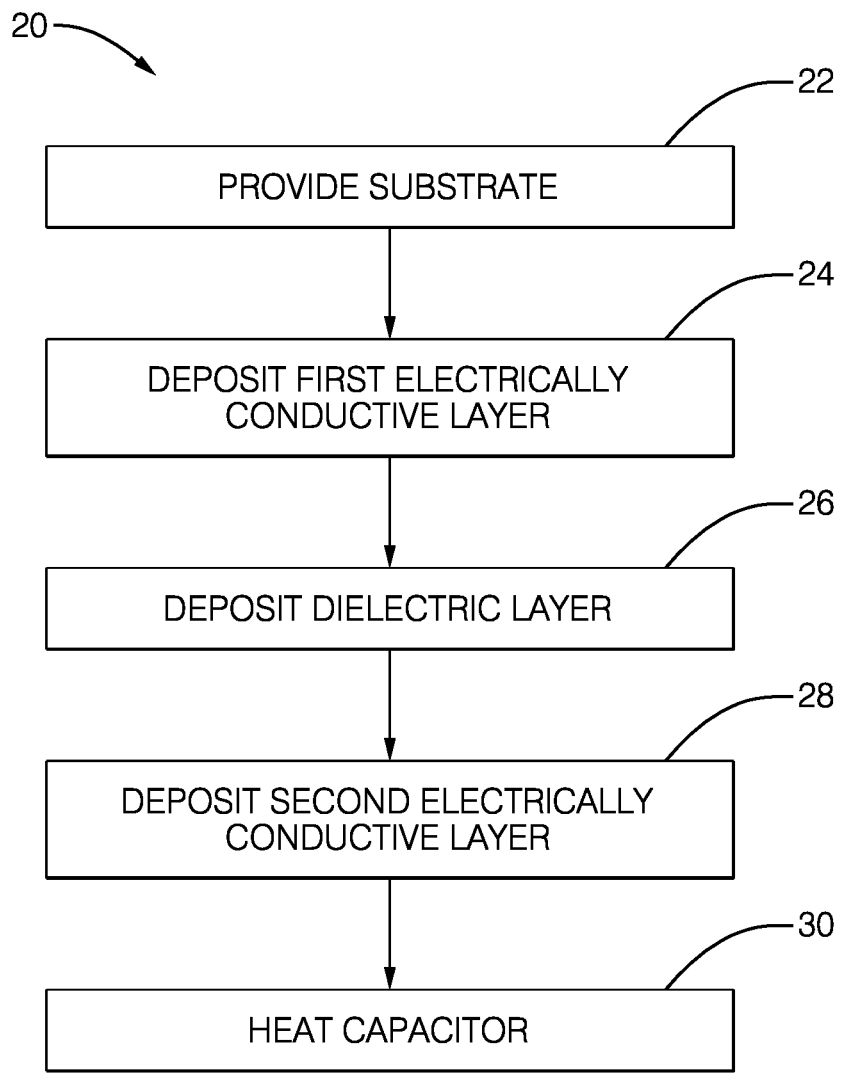
FIG. 4 is a flowchart of a method for increasing a dielectric constant of the ceramic-capacitor of FIG. 1 in accordance with one embodiment.

FIG. 4 is a flowchart that illustrates a non-limiting example of a method 20 of fabricating and heat-treating the ceramic-capacitor 10 characterized by a dielectric constant of greater than 125 at 25° C., zero Volts bias, and an excitation frequency of 10 kHz.

Step 22, PROVIDE SUBSTRATE, may include providing the substrate 12 formed of one of a glass, a ceramic, and a polymeric material. By way of example and not limitation, the substrate 12 may be formed of a polymeric material such as APICAL® AV polyimide film from Kaneka Texas Corporation of Pasadena Tex., with a thickness of 50 micrometers (50 µm). Such polymeric substrates are commonly used in the fabrication of film-type capacitors and are suitable for use in high-volume, roll-to-roll, manufacturing processes. Alternatively, the substrate may be a metal foil.

Step 24, DEPOSIT FIRST ELECTRICALLY CONDUCTIVE LAYER, may include depositing the first electrically-conductive-layer 14 on top of the substrate 12, formed of one of platinum, nickel, copper, and aluminum, utilizing an evaporative deposition process, such as electron-beam evaporation. Preferably the first electrically-conductive-layer 14 is aluminum, with a thickness of 100 nm to a thickness of 200 nm, and preferably 120 nm, which provides adequate electrical conductivity and flexibility.

Step 26, DEPOSIT DIELECTRIC LAYER, may include depositing the dielectric-layer 16 formed of PLZT deposited on top of the first electrically-conductive-layer 14 preferably using an aerosol spray process. The aerosol spray process may be performed at a deposition-temperature between 10° C. and 38° C., and preferably room temperature, which advantageously requires neither heating nor cooling of the manufacturing facility. Preferably, the velocity of impact of the submicron air-born PLZT particles generates the required heat to sinter the particles together upon deposition onto the first electrically-conductive-layer 14. PLZT is a ceramic material that has a high dielectric constant and is capable of operating at temperatures greater than 140° C. Empirical testing has indicated that a thickness for the PLZT layer of 8 µm provides for a good balance between dielectric breakdown and reliability, where the desired maximum capacitor voltage is 600 Volts. This deposition process is desirable in that the PLZT material is a ceramic that would typically require a firing process in excess of 650° C. to sinter the particles into a solid monolithic structure. Using conventional ceramic processing methods, the firing temperatures required to sinter the PLZT particles would melt a polymer substrate 12. Advantageously, it is the ability to deposit the PLZT at temperatures not greater than the melting point of the polymer substrate 12 that enables the use of high-volume film processing methods for a ceramic-capacitor 10.

Step 28, DEPOSIT SECOND ELECTRICALLY CONDUCTIVE LAYER, may include depositing the second electrically-conductive-layer 18 on top of the dielectric-layer 16, formed of one of platinum, nickel, copper, and aluminum, utilizing an evaporative deposition process, such as electron-beam evaporation. Preferably the second electrically-conductive-layer 18 is aluminum, with a thickness of 100 nm to a thickness of 200 nm, and preferably 120 nm, which provides adequate electrical conductivity and flexibility.

Step 30, HEAT CAPACITOR, may include heating the ceramic-capacitor 10 to a temperature not greater than 300° C. The heating may be conducted for a period of time such that the capacitance remains relatively linear as a function of voltage, frequency and temperature (much like a film capacitor), as opposed to the bell shaped curve that defines capacitance, of a traditional ceramic capacitor, as variable based on applied frequency, voltage or temperature. The capacitance of a traditional ceramic capacitor follows a bell shaped curve.

The heating of ceramic-capacitor 10 may be performed in an oven where a controlled source of heat may include one of electric resistive elements, gas-fired burners, rapid thermal annealing, infrared and ultraviolet light sources, and a laser.

Accordingly, a ceramic-capacitor 10, and a method 20 of increasing the dielectric constant of the PLZT is provided. By increasing the dielectric constant of the PLZT, less capacitive material is required to meet the targeted capacitance which, in turn, reduces the overall volume of the finished DC-link capacitor. Additionally, it is the ability to deposit the PLZT at temperatures not greater than the melting point of the polymer substrate 12 that enables the use of high-volume film processing methods for a ceramic-capacitor 10. The ability to affect the dielectric constant by adjusting the heat-treating time and heat-treating temperature allows the ability to both increase the dielectric constant and reduce the variation of the population of dielectric constant values, without sacrificing the dielectric breakdown strength.

While this invention has been described in terms of the preferred embodiments thereof, it is not intended to be so limited, but rather only to the extent set forth in the claims that follow.

We claim:

1. A ceramic-capacitor comprising:
   a first electrically-conductive-layer;
   a second electrically-conductive-layer arranged proximate to the first electrically-conductive-layer; and
   a dielectric-layer interposed between the first electrically-conductive-layer and the second electrically-conductive-layer, said dielectric-layer formed of a lead-lanthanum-zirconium-titanate material (PLZT), wherein the PLZT is characterized by a dielectric-constant greater than 125 when measured at 25 degrees Celsius, zero Volts bias, and an excitation frequency of ten-thousand Hertz (10 kHz).

2. The ceramic-capacitor in accordance with claim 1 wherein the dielectric-layer is deposited using an aerosol spray process.

3. The ceramic-capacitor in accordance with claim 1 wherein a first side of the dielectric-layer is in direct contact with the first electrically-conductive-layer, and a second side of the dielectric-layer opposite the first side is in direct contact with the second electrically-conductive-layer.

* * * * *